United States Patent
Lee et al.

(10) Patent No.: US 7,491,920 B2
(45) Date of Patent: Feb. 17, 2009

(54) MICROLENSED FOCAL PLANE ARRAY (FPA) USING SUB-PIXEL DE-SELECTION FOR IMPROVED OPERABILITY

(75) Inventors: Donald L. Lee, Thousand Oaks, CA (US); William E. Tennant, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 51 days.

(21) Appl. No.: 11/347,536

(22) Filed: Feb. 2, 2006

(65) Prior Publication Data

US 2007/0176082 A1 Aug. 2, 2007

(51) Int. Cl.
*H01L 27/00* (2006.01)
*H04N 9/64* (2006.01)

(52) U.S. Cl. ................................. 250/208.1; 348/246

(58) Field of Classification Search .............. 250/208.1, 250/208.6, 214 R; 348/246, 247
See application file for complete search history.

(56) References Cited

U.S. PATENT DOCUMENTS

| | | | |
|---|---|---|---|
| 5,262,871 A * | 11/1993 | Wilder et al. | 348/307 |
| 5,614,950 A * | 3/1997 | Park et al. | 348/315 |
| 6,593,562 B1 * | 7/2003 | Parrish et al. | 250/208.1 |
| 6,660,988 B2 | 12/2003 | Lee et al. | |
| 7,034,874 B1 * | 4/2006 | Reinhart et al. | 348/246 |
| 2004/0036788 A1 * | 2/2004 | Chapman et al. | 348/308 |
| 2006/0038128 A1 * | 2/2006 | D'Souza et al. | 250/332 |

OTHER PUBLICATIONS

Motamedi, M.E., et al, "FPAs and Thin Film Binary Optic Microlens Integration," Miniaturized Systems with Micro-Optics and Micromechnics, SPIE, vol. 2687, Jan. 30-31, 1996, p. 70.
Arias, J.M., et al, "Planar p-on-n HgCdTe heterostructure photovoltaic detectors," Appl. Phys. Lett. 62(9), Mar. 1, 1993, pp. 976-978.
Sankur, H.O. & Motamedi, M.E., "Microoptics development in the past decade," Micromachining Technology fofr Micro-Optics, Proceedings of SPIE, vol. 4179 (2000), pp. 30-35.
Motamedi, et al. "FPA's and Thin Film Binary Optic Microlens Integration", Miniaturized Systems with Micro-Optics and Micromechanics, vol. 2687, Jan. 1996, p. 70.
J. Arias et al., "Planar p-on-n HgCdTe Heterostructure Photovoltaic Detectors", Appl. Phys. Lett. 62 (9), Mar. 1, 1993, pp. 976-978.
H.O. Sankur et al., "Microoptics Development in the Past Decade", Micromachining Technology for Micro-Optics, Proceedings of SPIE vol. 4179 (2000), pp. 30-35.

* cited by examiner

*Primary Examiner*—Thanh X Luu
(74) *Attorney, Agent, or Firm*—Koppel, Patrick, Heybl & Dawson

(57) ABSTRACT

A cost-effective FPA includes a plurality of detectors per pixel, wherein radiation is directed by a microlens array into respective focal regions that are covered by the union of the detectors' collections regions within each pixel and any defective detectors are de-selected in the ROIC. The operability of each pixel is evaluated, and a map generated specifying detector de-selection for each pixel. This map is read into memory in the ROIC to de-select bad detectors. Bad detectors are preferably allowed to float to a photovoltage and re-emit some of their accumulated photo charge to neighboring detectors to improve collection efficiency. The radiation levels are preferably read out on a pixel-by-pixel basis. Accordingly, the signals from the selected detectors are combined within each pixel.

18 Claims, 5 Drawing Sheets

MICROLENSED FOCAL PLANE ARRAY (FPA) USING SUB-PIXEL DE-SELECTION FOR IMPROVED OPERABILITY

BACKGROUND OF THE INVENTION

1. Field of the Invention

This invention relates to microlensed FPAs and more specifically to a method of configuring the detector array and ROIC for sub-pixel de-selection to improve operability.

1. Description of the Related Art

A photodetector registers photon flux striking it as a function of time. An array of a large number of photodetectors can simultaneously register the photon fluxes from many spatial points (called pixels) to form an electronic version of an optical image. In such arrays, some detectors will often be inoperable due to randomly located material defects such as structural dislocations and processing defects that cause electrical shorts or unacceptably high tunneling currents, resulting in poor image uniformity. A detector is typically considered operable if its sensitivity (signal-to-noise ratio, or some other parameter such as quantum efficiency, noise, or dark current or a combination of these parameters) is within a given multiple, say 2-3×, of the mean sensitivity of the array. A defective or bad detector will typically be much worse than this.

Smaller photodetectors reduce the impact of defects which are typically localized in the material, since the detectors cover a smaller area of the material layer and have a reduced chance of intersecting a local defective region. However, smaller detectors also have reduced optical collection efficiency. Focal Plane Arrays (FPAs) use microlenses which concentrate incident radiation into a detector region, thereby permitting smaller area detectors without significant loss of optical collection efficiency. (see Motamedi, et al, FPA's and Thin Film Binary Optic Microlens Integration, Miniaturized Systems with Micro-Optics and Micromechanics, Volume 2687, January 1996, page 70). Using this technique, operability in the 90-98% range has been achieved for strategic Very Long Wavelength Infrared (VLWIR) FPAs operating at 40K. Still, for many applications including hyperspectral imaging using VLWIR FPAs, even 90-98% operability and also clusters of bad pixels may be deemed unacceptable because either spatial or spectral information in a critical band may be lost. These applications may demand high operability, generally 99% or greater, which is presently not achieved even with the use of microlens arrays.

U.S. Pat. No. 6,660,988 to Lee, et al describes an FPA array, and method for fabricating an FPA array, having a plurality of detectors per pixel. The FPA has a microlens array which is custom designed to focus and direct radiation to the most operative detector in each pixel. Each detector is connected to a separate and selectable input of a multiplexer (MUX) or readout integrated circuit (ROIC). Since FPAs are generally tested before the fabrication of the microlens array, the operability of each detector can be evaluated, and a file generated specifying detector operability for each pixel. This file is used to generate a custom microlens mask for fabricating the array using photolithography, in which the shape of the lens for each pixel is chosen to direct the lens focus spot to the best detector in each pixel. The better detector is similarly selected for readout by the MUX or ROIC while the other detectors are not selected. Lee's approach reduces the impact of both material and fabrication defects, since detectors which are defective for any reason can be screened out. Thus, for an array having two detectors per pixel, if the probability of any one detector being defective is 2-10%, the probability of both detectors per pixel being defective is approximately 0.04-1%.

However, Lee's approach requires a custom microlens mask set that is determined by the most operative detector selection for each FPA, which is expensive. In addition, should any of these most operative detectors fail subsequent to microlens application, the pixel will be defective. Furthermore, once the initial testing is done and the microlens is fabricated, it is not possible to recalibrate the FPA to change the selected detector in each pixel.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a cost-effective, robust and flexible FPA having a plurality of sub-pixel detectors per pixel, wherein radiation is directed to all of the sub-pixel detectors in each pixel by a microlens array and any defective detectors are de-selected in the ROIC.

In a preferred embodiment, the FPA has a microlens array that concentrates radiation into a focal region within each pixel that is covered by the union of the detectors' collection regions. Each detector is connected to a separate and selectable input of a ROIC. The operability of each detector is evaluated, and a map generated specifying detector operability for each pixel. The FPA may be periodically recalibrated and the map updated. This map is read into memory in the ROIC to de-select bad detectors. Detectors are preferably located in close proximity to each other and bad detectors are allowed to float to a photovoltage and re-emit some of their accumulated photo charge to neighboring detectors to improve collection efficiency. The signal created by this collected radiation-induced charge within each pixel is preferably read out on a pixel-by-pixel basis. Accordingly, the signals from the selected detectors are combined within each pixel.

This approach reduces the impact of both material and fabrication defects, since detectors which are defective for any reason can be screened out. This approach has minimal impact on cost, since the same microlens mask set can be used for each FPA and the ROIC can be configured for de-selection quite easily. Any reduction in optical collection efficiency associated with the de-selection of an illuminated detector is mitigated somewhat by allowing bad detectors to float. The slightly lower performance compared to Lee's approach is in most cases more than offset by the cost and time savings of not requiring a custom microlens mask set for each FPA. Furthermore, the ROIC can be reconfigured in the field during periodic recalibration. Thus, if a sub-pixel detector goes bad it can be de-selected and the pixel remains operable. In addition, because the pixel current represents the sum of multiple detectors, the pixel may be more robust to any degradation in any individual detector.

These and other features and advantages of the invention will be apparent to those skilled in the art from the following detailed description of preferred embodiments, taken together with the accompanying drawings, in which:

DETAILED DESCRIPTION OF THE INVENTION

The present invention provides an FPA having a plurality of sub-pixel detectors per pixel, wherein radiation is directed to all of the detectors in each pixel by a microlens array and any defective detectors are de-selected in the ROIC. An FPA comprises three essential components: a microlens array, a detector array and a ROIC. The present invention modifies the detector array and ROIC to provide for de-selection of bad sub-pixel detectors in each pixel at manufacturer and, possibly, during periodic recalibration to improve operability. The present invention uses conventional microlens designs that are independent of the de-selection of particular sub-pixel detectors. This allows for the use of a single standard microlens mask set for each FPA to keep costs down.

There are many types of FPAs for detecting electromagnetic radiation of varying wavelengths. This invention is applicable to virtually any type of FPA, and is most useful for very long wavelength Infrared (VLWIR) detecting FPAs, as materials often used for these, such as Mercury Cadmium Telluride (HgCdTe), have a particularly high number of harmful defects which result in relatively low operability and poor image uniformity.

Figure 1A:
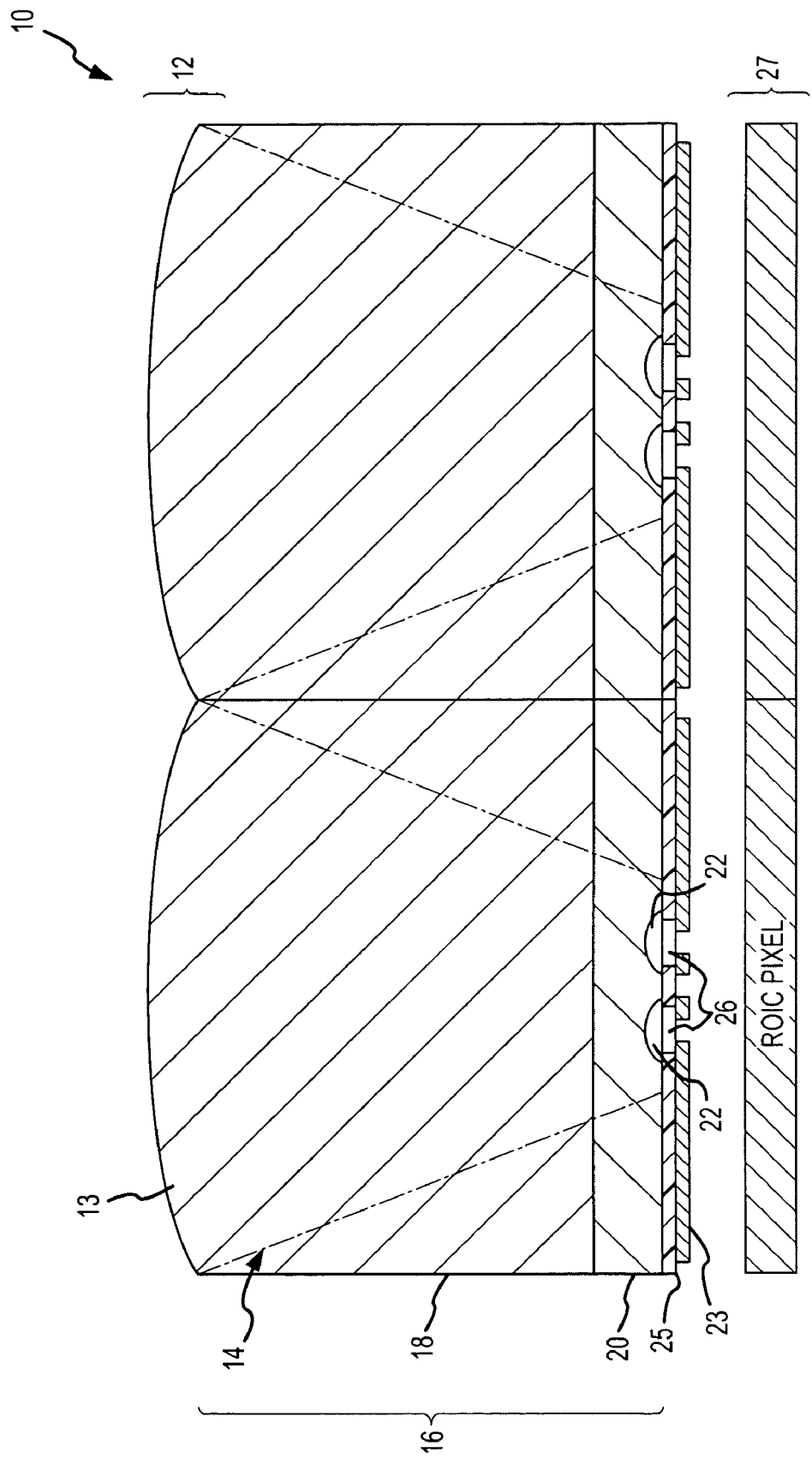
FIGS. 1a and 1b are section views of a microlensed FPA and readout integrated circuit (ROIC) that embodies sub-pixel de-selection in accordance with the present invention.
Figure 1B:
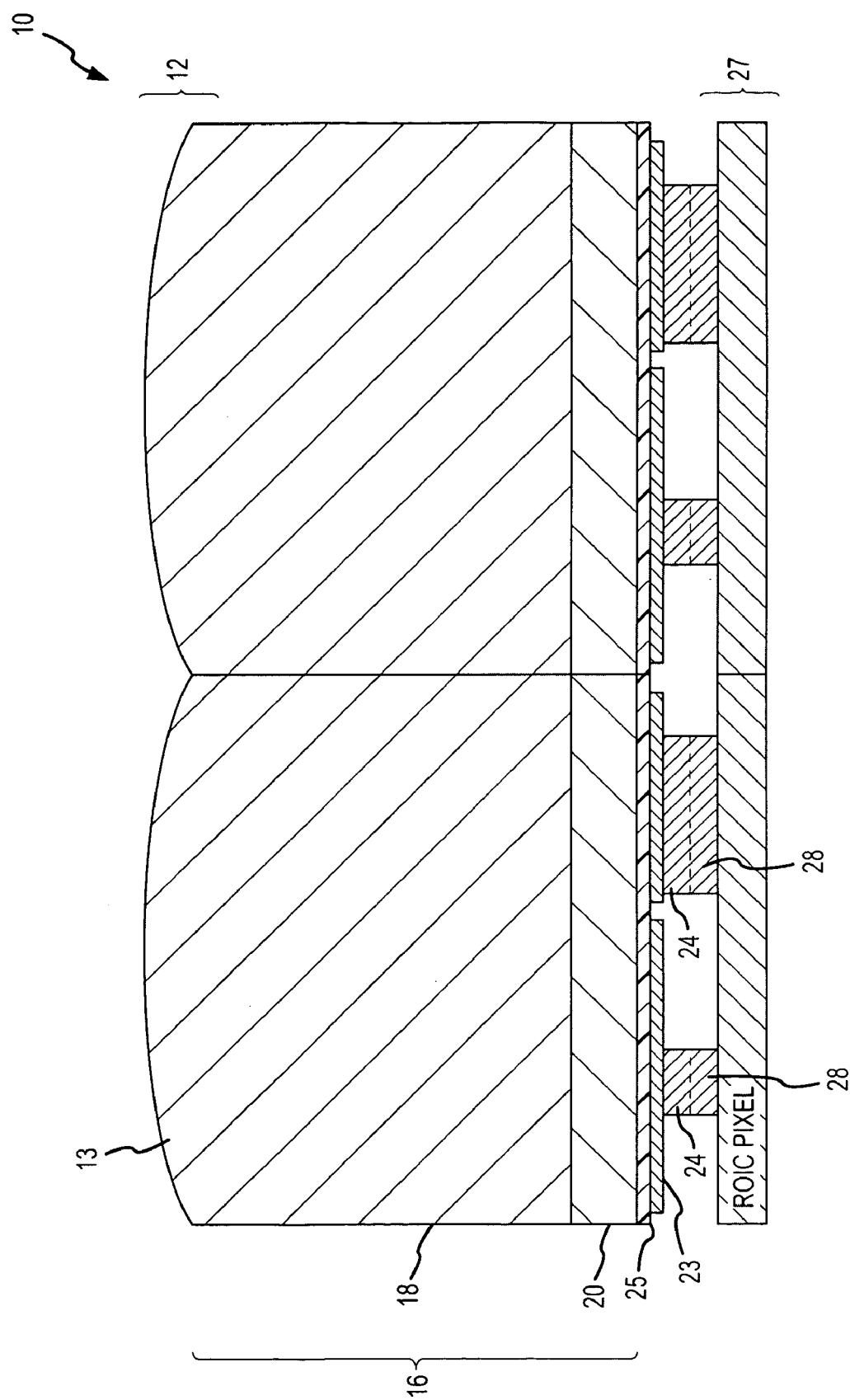
Figure 2:
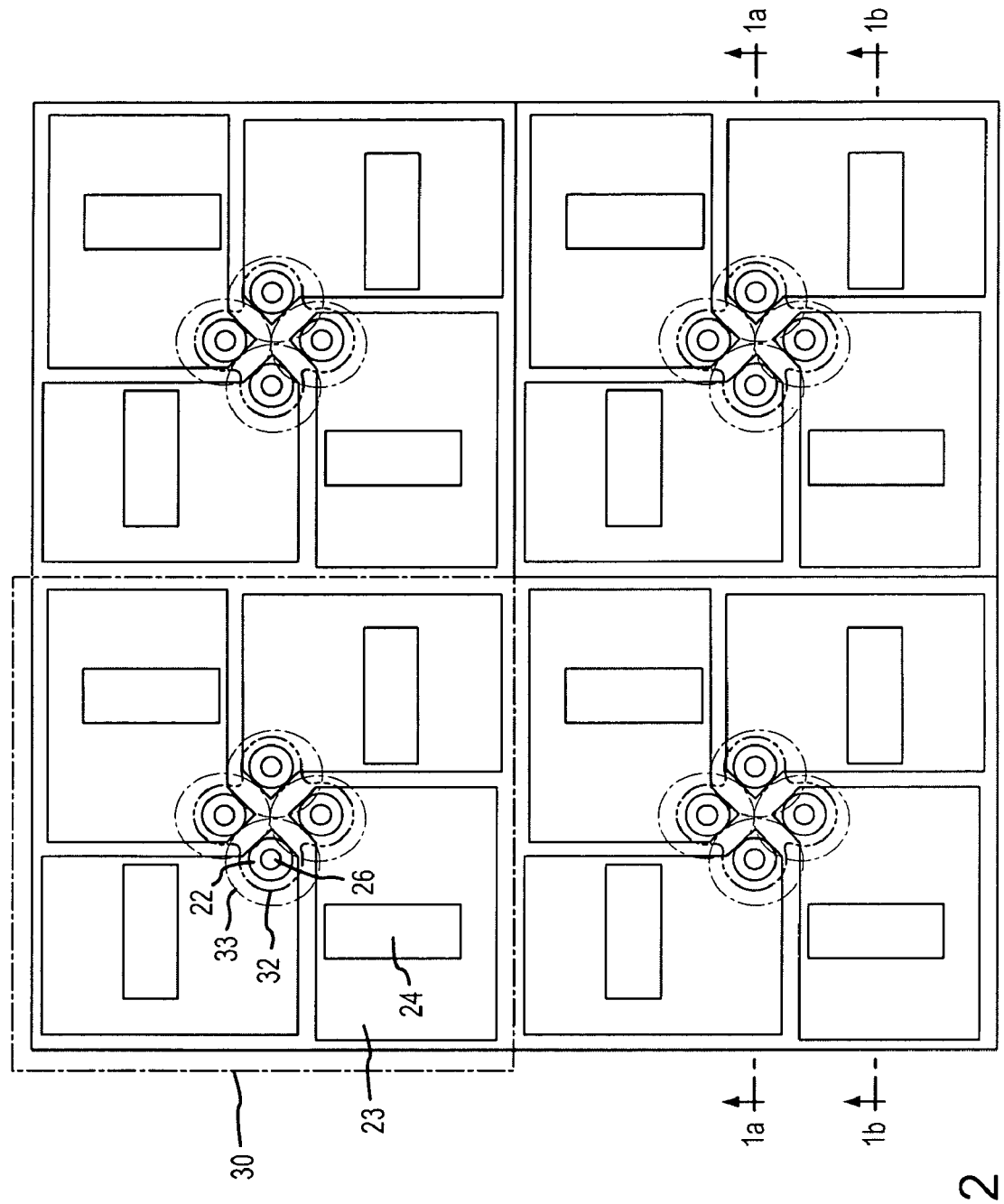
FIG. 2 is a plan view of the FPA showing the microlens focal regions centered on each pixel and covered by the union of the detector collection regions.

As shown in FIGS. 1a, 1b, and 2 by a few representative pixels, an FPA 10 includes a detector array 16 having a plurality of sub-pixel detectors 22 per pixel 30, a microlens array 12 having lens elements 13 that concentrate incident electromagnetic radiation 14 into focal regions 32, e.g. >85-90% intensity contour, within each pixel that are covered by the union of that pixel's detector collection regions 33 to convert minority carriers generated by absorbed light into electric current, and a ROIC 27 that is programmed to de-select bad sub-pixel detectors and select good sub-pixel detectors, sum the electric current from the selected sub-pixel detectors and readout the electric current, preferably on a pixel-by-pixel basis.

In the embodiment depicted, detector array 16 includes a substrate 18 and a photosensitive layer 20 in which sub-pixel detectors 22 (typically diodes) are embedded. Each sub-pixel detector will collect the minority carriers generated by light absorbed into the photosensitive layer 20 within its depletion region (detector area) and within the nearby charge neutral region up to about a diffusion length from the detector perimeter (together detector "collection region" 33) and convert the carriers into an electric current. By clustering the detectors 22 close to each other in the focal region 32 of the lens element (typically around the center of the pixel for a symmetric microlens) but relatively far from the sub-pixel detectors in other pixels, the concentrated light will fall into the overlapping collection regions of one or more of the sub-pixel detectors. In theory the detectors could be located anywhere within the pixel, but clustering them in an area in which the light can be concentrated is more efficient. Each sub-pixel has a contact bump 24, typically Indium, to establish electrical contact to the ROIC. The contact bump 24 lies on a metal contact pad 23, which in turn contacts the detector 22 through a contact via 26 in a passivation layer 25, thereby connecting the detector to the ROIC.

The microlens array 12 and individual lens elements 13 are designed to direct light to all of the sub-pixel detectors in each pixel. The light for each pixel is concentrated into a focal region, typically at the center of the pixel, that includes a large fraction of the light, suitably >90%. That focal region preferably covers each of sub-pixel detectors clustered around the center of the pixel. Because the design of the microlens array is independent of any de-selection, the lens elements have a predetermined shape (typically uniform for normally incident light) throughout the array and the microlens array has a predetermined design for a given FPA and system design. The design of the microlens array and individual lens elements is not affected by manufacturing defects in any particular FPA or subsequent de-selection of detectors.

In the depicted embodiment, the four sub-pixel detectors 22 per square pixel 30 are located at the ends of a "plus" sign equidistance from the center of the pixel so that the union of their overlapping collection regions 33 cover the star shaped focal region 32 of concentrated light, also known as a "blur circle", created by a square microlens 13. Other regular tiling patterns of substantially polygonal cells can also be used. Additionally, sub-pixel detector geometries may be used other than circular, including for example square or rectangular, or multiple diodes of arbitrary shape connected together by pad metal 23 may be used for sub-pixel detectors 22. Optimal positioning of the sub-pixel detectors 22 within the microlens focal region depends on the specific microlens design and will vary from one design to the other. Ideal optimization involves use of numerical methods which model the distribution of light from the microlens and the positioning of the detectors to maximize collected charge (taking into account lateral collection by diffusion).

The ROIC 27 has an array of mating bumps 28, typically also Indium, corresponding to the interconnect bumps on the detector array. Corresponding contact bumps on the ROIC and detector array are fused to form interconnections 24/28 (by cold welding in the case of Indium-Indium bumps) to form a hybrid unit. (Some versions of detector-ROIC arrays, such as silicon detector-readouts used in CCD cameras, are commercially sold as monolithic units). Note that in some processes the mating bump may be on only one component (detector array or ROIC) and mate to the metal pad on the other component. In some process also, the cold weld may be replaced by a heated reflow melting of the mating bump.

The ROIC 27 is designed to allow for each detector signal (electric current) to be either transmitted to an output of the input circuit, or blocked. Accordingly, the ROIC is configured and programmed to de-select bad detectors and read out only from the selected good detectors. De-selected detectors are preferably allowed to float to a photovoltage and re-emit some of their accumulated photo charge to neighboring detectors to improve collection efficiency. This works if the sub-pixel detectors 22 are clustered so that their collection regions 33 overlap. The signals from the selected detectors may be combined within each pixel prior to read out or read out and then combined. Combination of the selected signals within each pixel is generally preferred to reduce noise and simplify the ROIC. Suitable ROICs can be supplied and custom made by companies such as Rockwell, Raytheon, and DRS Infrared Technology.

Figure 3:
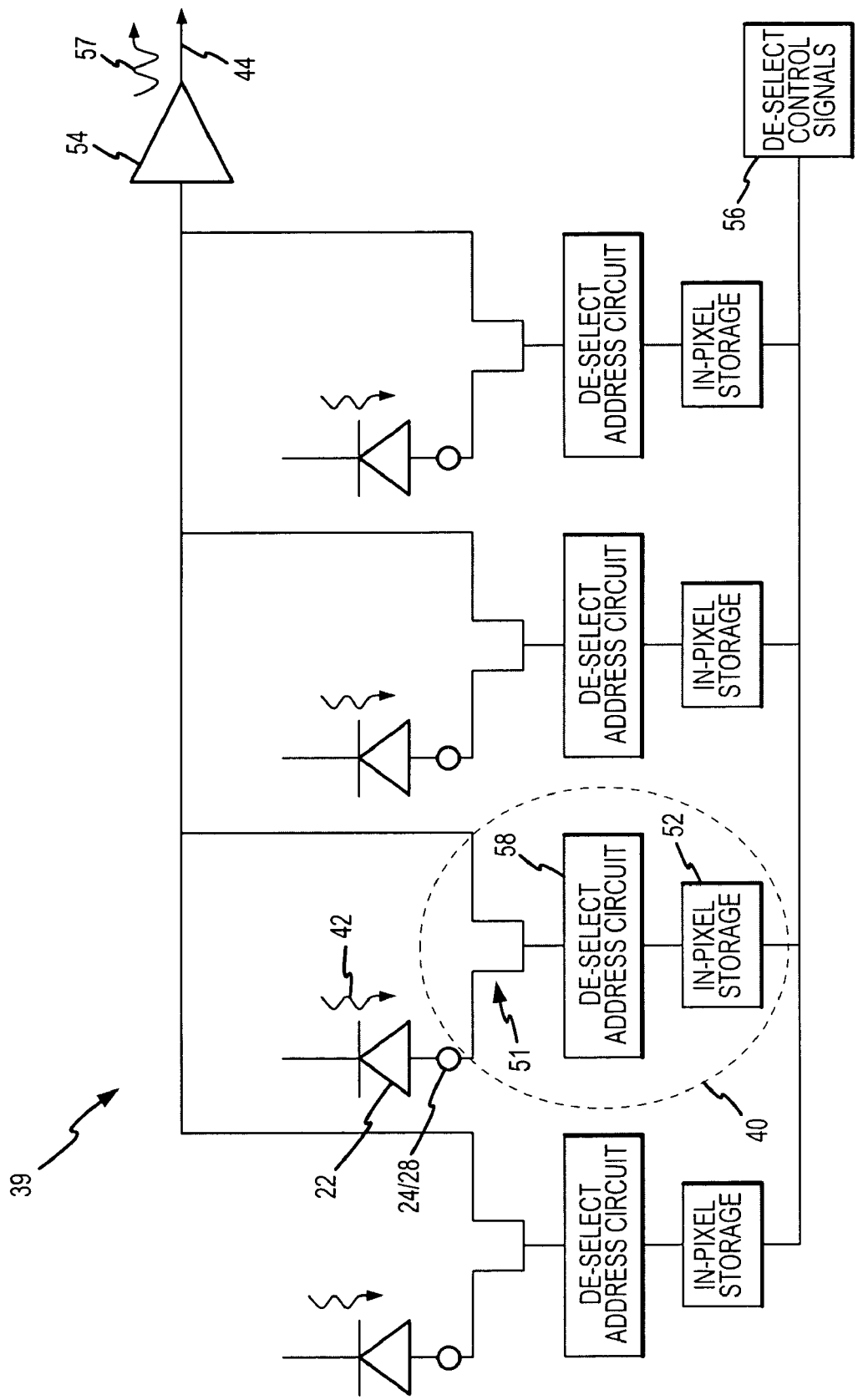
FIG. 3 is a schematic diagram of an ROIC input cell for one pixel including circuitry for sub-pixel de-selection.

As shown in FIG. 3, an exemplary embodiment of an input circuit 39 for one pixel of an ROIC 27 includes a plurality of switch elements 40 connected to respective detectors 22 via the fused indium bumps 24/28 and a summing amplifier 54. Each switch element includes a switch 51, suitably a CMOS transistor with its source connected to the detector and its drain connected to the summing amplifier, in-pixel storage 52 responsive to de-select control signals 56 to store a value indicating whether the corresponding sub-pixel detector is good or bad, and a de-select address circuit 58 that reads that value from storage to drive the switch 51 between a first state that transmits signal 42 from sub-pixel detector 22 to the summing amplifier (source-drain channel is conducting) and a second state that blocks transmittal of the signal to the amplifier (source-drain channel is non-conducting). When the CMOS switch 51 is turned off thereby blocking the detector signal, the detector is allowed to float to a photovoltage and re-emit some of the collected photocharge to neighboring detectors. Summing amplifier 54 sums the detector currents from the selected detectors and the pixel current 57 is read out at output 44. The ROIC processes the pixel currents to generate the intensity image.

Figure 4:
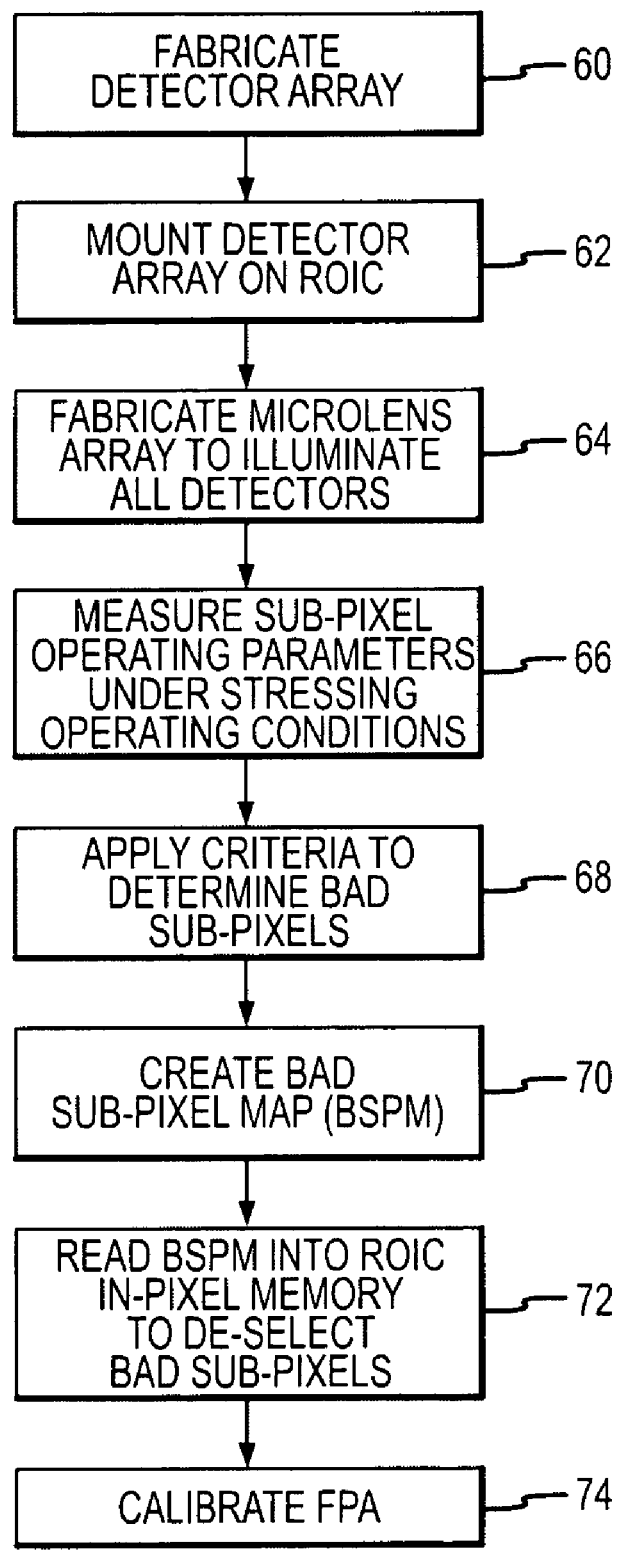
FIG. 4 is a flowchart of an embodiment for fabricating the FPA and configuring the ROIC for de-selection of defective sub-pixel detectors.

As shown in FIG. 4, the FPA 10 is fabricated and the ROIC 27 configured for de-selection by first fabricating the detector array (step 60) to have a desired number and configuration of detectors (sub-pixels) per pixel. The detector array can be fabricated using standard photomasking techniques to map out the desired detector pattern. (For an example see J. M. Arias, et al., "Planar p-on-n HgCdTe heterostructure photovoltaic detectors", Appl. Phys. Lett. 62(9), Mar. 1, 1993, pages 976-978). The detector array is fused to the ROIC by means of an array of mating bumps which correspond to the contact bumps on the detector array (step 62). At this point, the microlens array can be fabricated (step 64), preferably on the backside of the detector array substrate, so that each lens element directs and focuses incident radiation into a focal region that is cover red by the union the detectors collection regions. Alternately, the microlens can be fabricated as a separate array and attached to the backside of the detector array at this point or later in the process. A representative technique for forming microlenses on a substrate is described in H.O. Sankur and M.E. Motamedi, "Microoptics Development in the past decade", Micromachining Technology for Micro-Optics, Proceedings of SPIE Vol. 4179 (2000), pp. 30-35, which is hereby incorporated by reference.

After the FPA has been formed, it is illuminated with radiation and the ROIC is controlled to measure sub-pixel detector operating parameters to determine the quality of each detector and the operability of each pixel (step 66). Typically, QE, noise and dark current maps are generated under stressing conditions. Application specific selection criteria are applied to these maps to determine which detectors are to be de-selected, i.e. bad sub-pixels (step 68).

The selection of bad detectors within each pixel is based primarily upon each detector's ability to function properly. A properly functioning detector will have a high quantum efficiency, low dark current levels, and low noise levels. The de-selection of bad or defective detector may be carried out based primarily on these factors. When the array is exposed to detectable radiation, improperly functioning detectors will appear as either excessively high or low signals in the ROIC output. In an array with photodiode detectors, diodes which are defective due to material defects will produce a signal having a distinctly high current, which is most accurately detected by blocking external radiation. Defective diodes may also yield low signals due to processing defects such as poor electrical interconnects. For example, if the measured sensitivity (dark current, noise) is within a given multiple, say 2×, of the mean sensitivity of the array the detector is considered good. Otherwise the detector is declared bad.

The operating parameters can be measured and the criteria applied on a sub-pixel or pixel basis. For example, for each defective pixel the ROIC can be controlled to de-select all but one detector at a time, read out the pixel signals and determine which combination of detectors provides the best performance. Alternately, the ROIC can be controlled to de-select one detector at a time, read out the pixel signals and determine which combination of detectors provides the best performance. In the latter case, if none of the combinations are "operable" then the ROIC can be controlled to de-select two detectors at a time. Based on the measurements and criteria a binary bad sub-pixel map (BSPM) is created which indicates whether a detector is good or bad (step 70). The BPSM is read into ROIC in-pixel memory to de-select bad detectors (sub-pixels) (step 72).

Once the de-selection process has been completed and all de-selected detectors are disconnected from the ROIC input circuit, the FPA must calibrated to determine the proper scaling for each pixel (step 74), which is a standard procedure applied to virtually all IR FPAs in use today. The scaling is typically done in subsequent processing in the ROIC but could be incorporated in the input circuit itself.

In a "two-point" calibration procedure, the FPA is uniformly illuminated by two different fluxes (typically from a black body or integrating sphere) and the response of each pixel is noted. Each pixel is assumed to respond linearly to these fluxes (that is, the difference in output of the pixel can be expressed by a pixel-specific scale factor times the input flux difference). From the output corresponding to the two different fluxes, the linear equation for each pixel is computed. This procedure automatically takes into account the summed response and dark currents from the sub-pixel detectors within a pixel. It is sometimes desirable, to reduce the requirements for high dynamic range analog-to-digital conversion, that some gain adjustment may be made on a pixel by pixel basis as the FPA reads out the signal. Thus a pixel with two of four detectors de-selected, may be amplified by 2 times to insure that its output falls within a range similar to that of all the other pixels and thus does not require additional dynamic range from the ADC.

Although de-selection and calibration were described here as part of the initial manufacture and fielding of the FPA, the FPA and method of de-selection is very flexible and can accommodate varying strategies for detector de-selection. All that is required is to use the control signal to write a de-select value into the in-pixel memory whereby the address circuit will control the switch to block the detector signal and then to re-calibrate the gain. To some degree this could be done "on the fly" by looking at what is believed to be a uniform scene and using neighboring calibrated pixels for reference. The better way is to repeat (at least for the changed pixels) the "two-point" (gain and offset) calibration typically done for all FPAs periodically during their use or in depot maintenance.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A focal plane array (FPA) having an array of pixels, wherein each pixel comprises:
   a plurality of radiation detectors, each detector having a collection region, the detectors' collection regions overlapping within each said pixel;
   a lens element that concentrates incident radiation into a focal region that is covered by a union of the detectors' collection regions; and
   a plurality of switch elements connected to respective detectors, each said switch element being switchable between a first state for transmitting a signal received from its corresponding detector to an output and a second state for blocking transmittal of the signal for a de-selected detector,
   wherein when the switch element is in the second state the de-selected detector floats to a photovoltage and re-emits some of its accumulated photo charge into the neighboring detectors within the pixel.

2. The FPA of claim 1, wherein each pixel further comprises:
   a summing circuit that sums the transmitted signals to form a pixel signal.

3. The FPA of claim 1, wherein the switch elements for each pixel are switched in accordance with a map of bad radiation detectors such that the bad radiation detectors are de-selected.

4. The FPA of claim 3, wherein each switch element comprises:
   a switch that is switchable between said first and second states;
   in-pixel memory for storing a map value for the corresponding sub-pixel detector; and
   a de-select address circuit that is responsive to the map value to control said switch.

5. The FPA of claim 1, wherein the shape of the lens element is independent of the selection or de-selection of any of said detectors with each said pixel.

6. The FPA of claim 5, wherein the lens element concentrates the incident radiation into substantially uniform focal regions across the plurality of detectors in each pixel.

7. The FPA of claim 1, wherein the focal region does not lie completely within the collection region of any one of the radiation detectors within each said pixel.

8. The FPA of claim 1, wherein the number of detectors in said array exceeds the number of lens elements in said array.

9. The FPA of claim 1, wherein said detectors are off-center of the focal region for the respective pixels.

10. A focal plane array (FPA), comprising:
    a pixilated detector array including a plurality of radiation detectors in each pixel, said detectors having overlapping collection regions with each pixel;
    a microlens array including lens elements that concentrate incident radiation into respective focal regions that are covered by a union of the detectors' overlapping collection regions within each pixel;
    and a ROIC that includes for each pixel:
       a summing circuit; and
       a plurality of switch elements connected between respective detectors and the summing circuit, each said switch element being switchable between a first state for transmitting a signal received from its corresponding detector to the summing circuit and a second state for blocking transmittal of the signal while allowing the de-selected detector to float to a photovoltage and re-emit some of its accumulated photo charge into the neighboring detectors within the pixel.

11. The FPA of claim 10, wherein the switch elements for each pixel are switched in accordance with a map of bad radiation detectors such that the bad radiation detectors are de-selected.

12. The FPA of claim 11, wherein each switch element comprises:
    a switch that is switchable between said first and second states;
    in-pixel memory for storing a map value for the corresponding sub-pixel detector; and
    a de-select address circuit that is responsive to the map value to control said switch.

13. The FPA of claim 10, wherein the shape of the lens elements is independent of the selection or de-selection of any of said detectors with each said pixel.

14. The FPA of claim 13, wherein the lens elements concentrate the incident radiation into substantially uniform focal regions across the detector array.

15. A method for operating a focal plane array (FPA), comprising:
    providing a pixilated FPA having a plurality of detectors per pixel, each said detector having a collection region;

directing radiation incident into respective focal regions that are covered by a union of the detectors' collection regions with each pixel, wherein the detectors' collection regions overlap within each pixel;

de-selecting bad detectors;

allowing the bad detectors to float to a photovoltage to re-emit accumulated charge to neighboring detectors within the pixel;

combining output signals from the remaining detectors within each pixel to form pixel output signals; and reading out the pixel output signals to form an output image.

16. The method of claim 15, further comprising:

storing a map of bad detectors in said FPA, and de-selecting the bad detectors in accordance with the map.

17. The method of claim 16, further comprising:

testing the FPA to determine defective detectors in the FPA; and updating the map stored in the FPA.

18. The method of claim 15, wherein the incident radiation is directed into the respective focal regions independent of the de-selecting of bad detectors.

* * * * *